US008420503B2

(12) United States Patent
Akiyama et al.

(10) Patent No.: US 8,420,503 B2
(45) Date of Patent: Apr. 16, 2013

(54) METHOD FOR PRODUCING SOI SUBSTRATE

(75) Inventors: Shoji Akiyama, Annaka (JP); Makoto Kawai, Annaka (JP); Atsuo Ito, Tokyo (JP); Yoshihiro Kubota, Annaka (JP); Kouichi Tanaka, Annaka (JP); Yuji Tobisaka, Annaka (JP); Hiroshi Tamura, Annaka (JP)

(73) Assignee: Shin_Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 12/933,113

(22) PCT Filed: Apr. 1, 2009

(86) PCT No.: PCT/JP2009/056805
§ 371 (c)(1),
(2), (4) Date: Sep. 17, 2010

(87) PCT Pub. No.: WO2009/123261
PCT Pub. Date: Oct. 8, 2009

(65) Prior Publication Data
US 2011/0014776 A1    Jan. 20, 2011

(30) Foreign Application Priority Data

Apr. 1, 2008  (JP) .................................. 2008-094538
Apr. 1, 2008  (JP) .................................. 2008-094594

(51) Int. Cl.
*H01L 21/762* (2006.01)

(52) U.S. Cl.
USPC .... 438/458; 438/479; 438/691; 257/E21.568; 257/E21.239

(58) Field of Classification Search .................. 438/458; 257/E21.568
See application file for complete search history.

(56) References Cited

U.S. PATENT DOCUMENTS

| 5,877,094 A | 3/1999 | Egley et al. |
| 6,238,935 B1 | 5/2001 | Egley et al. |

(Continued)

FOREIGN PATENT DOCUMENTS

| FR | 2 888 663 A1 | 1/2007 |
| JP | 1-105987 A | 4/1989 |

(Continued)

OTHER PUBLICATIONS

Li-Juan Huang, Qin-Yi Tong, Tien-Hsi Lee, Yu-Lin Chao and Ulrich M. Gösele; A Model for Blistering and Splitting of Hydrogen Implanted Silicon and Its Application to Silicon-On-Quartz;Electrochemical Society Proceedings, May 4, 1998; vol. 98-1, pp. 1373-1384.

(Continued)

*Primary Examiner* — Walter H Swanson
(74) *Attorney, Agent, or Firm* — Roberts Mlotkowski Safran & Cole, P.C.; David S. Safran

(57) ABSTRACT

A method for easily manufacturing a transparent SOI substrate having: a main surface with a silicon film formed thereon; and a rough main surface located on a side opposite to a side where the silicon film is formed. A method for manufacturing transparent SOI substrate, having a silicon film formed on a first main surface of the transparent insulating substrate, while a second main surface of the transparent insulating substrate, an opposite to the first main surface, is roughened. The method includes at least the steps of: roughening the first main surface with an RMS surface roughness lower than 0.7 nm and the second main surface with an RMS surface roughness higher than the surface roughness of the first main surface to prepare the transparent insulating substrate; and forming the silicon film on the first main surface of the transparent insulating substrate.

9 Claims, 4 Drawing Sheets

U.S. PATENT DOCUMENTS

| | | | |
|---|---|---|---|
| 6,461,939 B1 * | 10/2002 | Furihata et al. | 438/459 |
| 6,774,040 B2 | 8/2004 | Comita et al. | |
| 7,670,929 B2 * | 3/2010 | Bourdelle et al. | 438/455 |
| 7,790,565 B2 | 9/2010 | Gadkaree et al. | |
| 2002/0058463 A1 | 5/2002 | Kurachi et al. | |
| 2005/0211673 A1 | 9/2005 | Kurachi et al. | |
| 2008/0299376 A1 * | 12/2008 | Ito et al. | 428/220 |
| 2009/0023267 A1 * | 1/2009 | Daval et al. | 438/406 |

FOREIGN PATENT DOCUMENTS

| | | | |
|---|---|---|---|
| JP | 2-178927 A | | 7/1990 |
| JP | 3-89323 A | | 4/1991 |
| JP | 7-283383 A | | 10/1995 |
| JP | 2002-160943 A | | 6/2002 |
| JP | 2006-210899 | * | 8/2006 |
| JP | 2006-324530 A | | 11/2006 |
| JP | 2007-123513 A | | 5/2007 |
| JP | 2007-179589 A | | 7/2007 |
| WO | 2005/029576 A2 | | 3/2005 |
| WO | 2005/029576 A3 | | 3/2005 |

OTHER PUBLICATIONS

International Search Report for International Application No. PCT/JP2009/056805.

Supplementary European Sarch Report Dated May 25, 2011 for Corresponding Application No. EP 09 72 9038.

Science of Silicon, Chapter 4, Section 4, Realize Science & Engineering Center Co., Ltd., Surface Science Technology Series 3, Realize Inc., pp. 316-349, Partial English Translation of pp. 319 & 320.

* cited by examiner (WHEN SINGLE CRYSTAL SILICON LAYER IS STACKED SANDBLASTING PROCESS)

METHOD FOR PRODUCING SOI SUBSTRATE

BACKGROUND OF THE INVENTION

1. Field of the Invention

The present invention relates to a method for manufacturing an SOI substrate, and particularly relates to a method for manufacturing an SOI substrate in which a silicon film is formed on one main surface of a transparent insulating substrate.

2. Description of Related Art

In order to achieve higher performance of semiconductor devices, attention has been focused on SOI (silicon on insulator) substrates in recent years. Additionally, some types of SOI substrates such as a silicon on quartz (SOQ) substrate and a silicon on glass (SOG) substrate which have support substrates (handle wafers) made of non-silicon materials are also expected to be applied to TFT-LCDs, high-frequency (RF) devices, other MEMS products, and so forth (for example, see JP2006-324530A).

There has been proposed a method for manufacturing the aforementioned SOQ substrate or the like, by using, for example, a silicon substrate for a donor wafer and a quartz substrate for a handle wafer, and bonding these different substrates together. Since the quartz substrate is transparent in the above bonded substrate, the bonded substrate may have different problems in process and evaluation from the problems of normal SOI substrates manufactured by bonding a silicon substrate to another silicon substrate.

One of such problems is that, when being conveyed on equipment, an SOI substrate including a silicon film formed on a transparent insulating substrate such as an SOQ substrate (hereinafter, sometimes abbreviated as a transparent SOI substrate) is unlikely to be recognized by an optical sensor for recognizing substrates, for example.

Meanwhile, a sandblasting method is used for applying a fogging treatment (frost treatment) to a substrate, component and so forth based on $SiO_2$ such as glass, quartz in some cases. In this method, a to-be-treated surface is blasted with alumina or silica fine particles to be roughened. The method is widely applied for diverse applications.

However, in the fields of electronic materials and devices, foggy surfaces formed by such a method have several problems. One of them is a particle (foreign matter) problem. This problem is caused by a sandblast powder remaining on a treated surface; dust generated from an acute portion, a crack and a damaged portion of a roughened surface; and so forth. These problems cannot be solved by normal cleaning in many cases. Moreover, a problem such as metal contamination attributable to this foreign matter is also serious in the field of electronic materials.

This particle problem can be critical particularly when a product treated by this fogging treatment is used in the field of semiconductor. For example, a quartz boat or the like for a wafer to be used in a diffusion furnace or the like is sometimes subjected to a fogging treatment to prevent the wafer from closely adhering to a groove for holding the wafer. In this case, since the quartz boat or the like undergoes a high-temperature process, certain measurement needs to be taken against metal contamination in addition to particles. Additionally, there is a problem that particles on transparent substrates such as those of SOQ (Silicon on Quartz) and SOG (Silicon on Glass) significantly increase in amount when back surfaces of the transparent substrates are subjected to the fogging treatment for making the transparent substrates recognizable by substrate-recognition sensors of various apparatuses.

To remove the particles after such a sandblasting process, a cleaning step is performed. In this cleaning step, HF cleaning has been employed, for example. The HF cleaning, however, has a problem of making the particle level rather worse. This is because the HF cleaning activates the surface of a glass or the like; moreover, fine pieces of the glass or the like released during the cleaning reattach to the surface (for example, see Science of Silicon, Chapter 4, Section 4, Realize Science & Engineering Center Co., Ltd.). Furthermore, if the cleaning is performed for a long period with high concentration HF to remove the particles, the surface subjected to the fogging treatment is made excessively smooth, thereby decreasing the effect of roughing the surface.

SUMMARY OF THE INVENTION

The present invention has been made in view of problems as described above. An object of the present invention is to provide a method for easily manufacturing an SOI substrate which comprises a transparent insulating substrate and a silicon film formed on a main surface of the substrate, while the other main surface thereof (an opposite to the main surface having the silicon film formed thereon) is roughened.

The present invention has been made to address the above problems. The present invention provides a method for manufacturing an SOI substrate, the SOI substrate comprising at least a transparent insulating substrate and a silicon film, wherein the silicon film is formed on a first main surface of the transparent insulating substrate, while a second main surface of the transparent insulating substrate, an opposite to the first main surface, is roughened. The method comprises at least the steps of: roughening the first main surface with an RMS surface roughness lower than 0.7 nm and the second main surface with an RMS surface roughness higher than the surface roughness of the first main surface to prepare the transparent insulating substrate; and forming the silicon film on the first main surface of the transparent insulating substrate.

As described above, the method for manufacturing an SOI substrate comprising the steps of roughening and forming makes it possible to easily manufacture an SOI substrate comprising a transparent insulating substrate and a silicon film formed thereon and having a back surface (a main surface where the silicon film is not formed) roughened.

Moreover, according to the above SOI substrate, the back surface of the transparent insulating substrate has a high surface roughness, and scatters a signal from a recognition unit containing an optical sensor, thereby successfully preventing a problem that a substrate is not recognized with the recognition unit. Additionally, this helps to prevent slippage of the substrate during the conveyance, and the like.

According to a method for manufacturing an SOI substrate of the present invention, it is possible to easily manufacture an SOI substrate (transparent SOI substrate) comprising a transparent insulating substrate and a silicon film formed thereon and having a back surface (a main surface where the silicon film is not formed) roughened.

Moreover, according to the above SOI substrate, the back surface of the transparent insulating substrate has a high surface roughness, and scatters a signal from a recognition unit containing an optical sensor, thereby allowing the recog-

DETAILED DESCRIPTION OF THE INVENTION

Hereinafter, the present invention will be described in more details.

As described above, conventionally, an SOI substrate comprising a transparent insulating substrate and a silicon film formed thereon, such as an SOQ substrate, has one of the problems that the SOQ substrate has difficulty in being recognized by an optical sensor for recognizing substrates while the SOQ substrate is conveyed on equipment, for example. Furthermore, there is another problem that the amount of particles significantly increases when a sandblasting process is performed on a glass, and then rather increases even though subsequent cleaning is performed.

The present inventors have discovered the following facts against these problems. Specifically, prepared in advance is a transparent insulating substrate having main surfaces with different surface roughnesses. A silicon film is formed on one of the main surfaces, a smooth main surface, of this transparent insulating substrate. This enables to manufacture, easily without complicated steps, an SOI substrate comprising a transparent insulating substrate and a silicon film formed thereon and having a rough back surface (a main surface opposite to the main surface where the silicon film is formed). Such an SOI substrate is capable of preventing a recognition unit from failing to recognize the substrate. Furthermore, the inventors have discovered that cleaning can be performed effectively in the following manner. Specifically, first, HF cleaning is performed on a sandblasted surface of a glass substrate to etch the source of particles. Then, alkali cleaning is performed in order that foreign matter released and adhered to the glass substrate in the course of the HF cleaning can be removed and prevented from re-adhering. Accordingly, effective cleaning is carried out. Thus, the inventors have completed the present invention.

Hereinbelow, embodiments of the present invention will be described with reference to the drawings. However, the present invention is not limited thereto.

Figure 1:
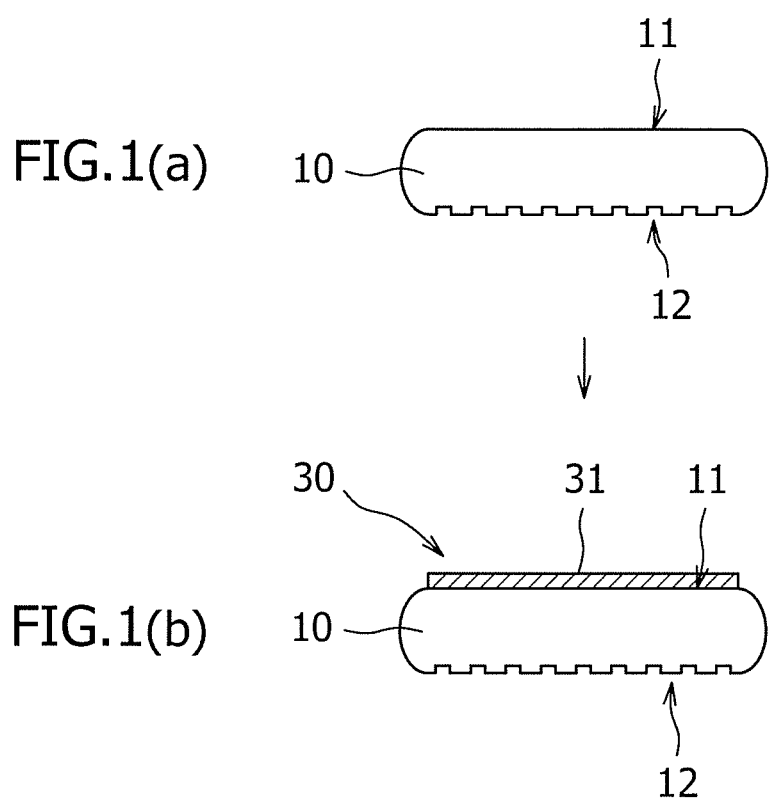
FIG. 1 is a flowchart showing one example of a method for manufacturing an SOI substrate according to the present invention.

FIG. 1 is a flowchart showing one example of a method for manufacturing an SOI substrate of the present invention.

The entire flow will be described. A transparent insulating substrate is prepared which has one main surface with a surface roughness higher than that of the other main surface (step a). A silicon film is formed on the smoother one of the main surfaces of the transparent insulating substrate (step b). Thus, an SOI substrate is manufactured which has the rough back surface and comprises the silicon film formed on the transparent insulating substrate.

Specifically, in step a, a transparent insulating substrate 10 is prepared as shown in FIG. 1(a). Note that, among main surfaces of the transparent insulating substrate 10, a main surface on which a silicon film is formed in step b is called a "first main surface" in this description for convenience, while a main surface opposite to the first main surface is called a "second main surface." The transparent insulating substrate 10 has a first main surface 11 with an RMS surface roughness lower than 0.7 nm, and has a second main surface 12 with an RMS surface roughness higher than the surface roughness of the first main surface. The reason why the two main surfaces have such surface roughnesses will be described later. The RMS is the square root of the average of the squares of deviations from an average line to a measured curved line.

Incidentally, the kind of the transparent insulating substrate usable in the present invention is not particularly limited. For example, any of a quartz substrate, a glass substrate, and a sapphire substrate can be used, and can be appropriately selected depending on the purpose or the like of a semiconductor device to be fabricated after the selected substrate is formed into an SOI substrate.

In this case, the step of roughening preferably comprises at least: performing double-sided lapping and etching on the first main surface and the second main surface; and then performing single-sided polishing on only the first main surface.

If the transparent insulating substrate is prepared in the above described manner by at least performing the double-sided lapping and the etching and then performing the single-sided polishing, there are following advantages. Specifically, a damaged layer after the lapping can be removed, and generation of particles from the roughened back surface can be effectively suppressed. Moreover, since only one surface needs to be polished, the cost reduction is achieved in comparison with a case where one surface is roughened after double-sided polishing.

In this case, it is preferable to comprise annealing the transparent insulating substrate after the double-sided lapping and the etching but before the single-sided polishing.

The annealing performed after the double-sided lapping and the etching as described above can effectively prevent the change in the wafer shape during the subsequent single-sided polishing.

Next, in step b, a silicon film 31 is formed on the first main surface 11 of the transparent insulating substrate 10 as shown in FIG. 1(b). Thus, an SOI substrate 30 is formed.

In the method for manufacturing an SOI substrate of the present invention, the step of forming a silicon film can comprise at least: implanting hydrogen ions and/or rare gas ions from a surface of a silicon substrate or a surface of a silicon substrate having an oxide film formed thereon to form an ion-implanted layer; tightly bonding the ion-implanted surface of the silicon substrate or the ion-implanted surface of the silicon substrate having the oxide film formed thereon onto the first main surface of the transparent insulating substrate; and peeling the bonded silicon substrate or the bonded silicon substrate having the oxide film thereon along the ion implanted layer as a boundary to form the silicon film on the first main surface of the transparent insulating substrate.

Forming the silicon film by the peeling using the ion implanted layer as a boundary after the ion implantation in the above-described manner enables forming a highly-crystalline silicon film thinly.

Moreover, the transparent insulating substrate is preferably a quartz substrate, a glass substrate, or a sapphire substrate.

The transparent insulating substrate used in the method for manufacturing an SOI substrate of the present invention can be appropriately selected among these depending on the purpose of a semiconductor device to be fabricated.

In step a of roughening, the specific production method for such a transparent insulating substrate 10 is not particularly limited. Additionally, in step b, the formation method for the silicon film 31 on the first main surface 11 is not particularly limited, either. However, these can be performed as follows, for example.

Figure 2:
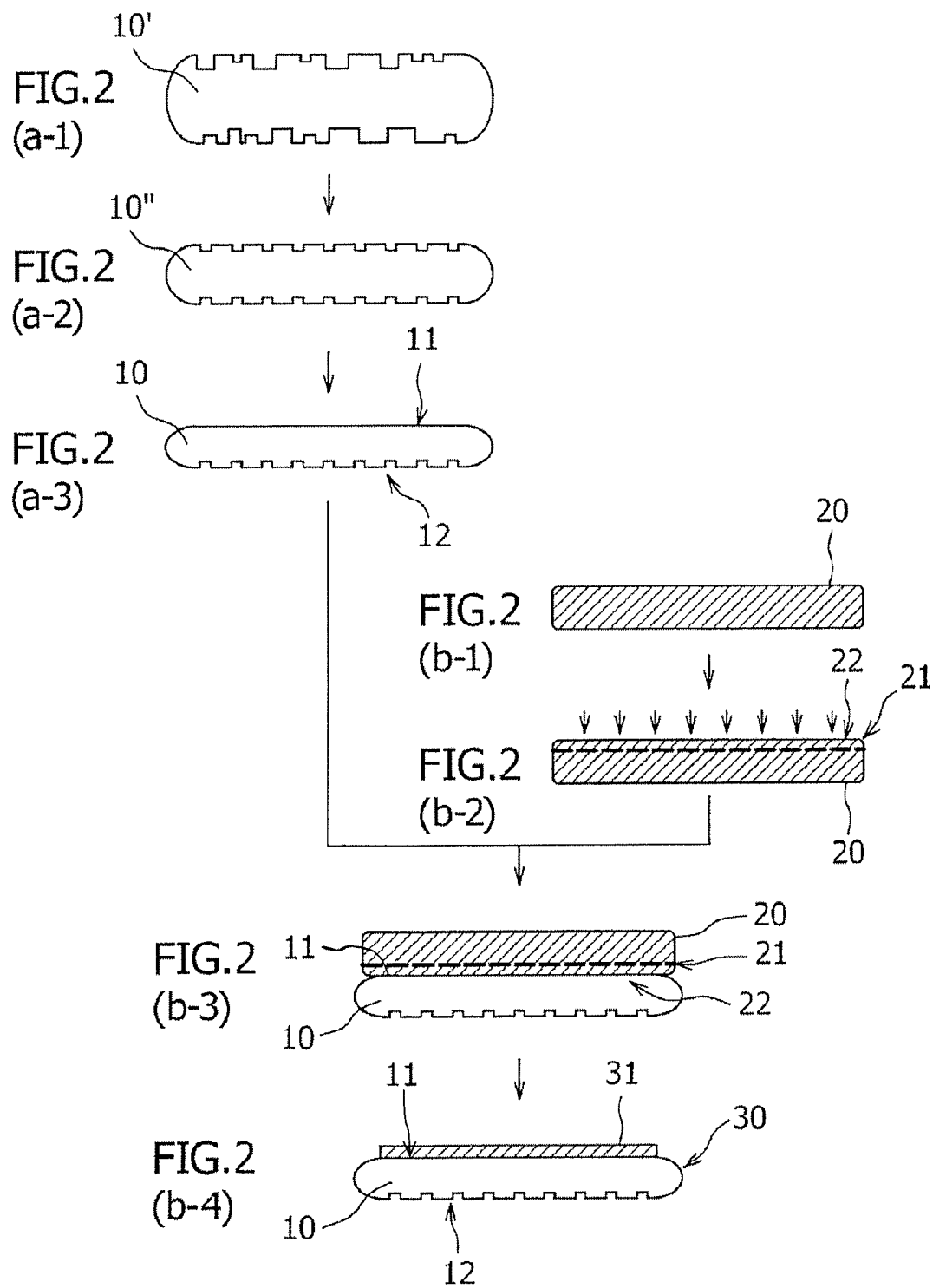
FIG. 2 is a flowchart showing one example of a specific mode of the method for manufacturing an SOI substrate according to the present invention.

FIG. 2 shows an example of a more specific mode of the method for manufacturing a transparent insulating substrate according to the present invention. Note that FIGS. 2(a-1) to (a-3) correspond to step a described above, while FIGS. 2(b-1) to (b-4) correspond to step b described above.

First, as schematically shown in FIG. 2(a-1), a transparent insulating substrate 10' is prepared which has two main surfaces being rough surfaces (substep a-1). For example, a quartz substrate cut out from a quartz ingot in the form of slice can be used. In this state, both of the main surfaces of the transparent insulating substrate 10' are rough surfaces that are relatively unadjusted.

Next, as schematically shown in FIG. 2(a-2), double-sided lapping is performed in which the two main surfaces of the transparent insulating substrate 10' are lapped (substep a-2). Note that, in this case, etching with hydrofluoric acid or the like is preferably performed so as to remove a damaged layer after the lapping.

Here, the double-sided lapping is preferably performed in such a mode that the two surfaces are treated simultaneously because it is easy to perform. However, the treatment may be performed on one surface at a time.

The two main surfaces of a transparent insulating substrate 10" subjected to the double-sided lapping and the etching as described above are rough surfaces having surface roughnesses relatively adjusted.

Next, as schematically shown in FIG. 2(a-3), polishing is performed only on one surface of the transparent insulating substrate 10" subjected to the double-sided lapping and the etching (substep a-3). The polished main surface serves as the first main surface (i.e., the surface where a silicon film is to be formed later) 11, while the un-polished main surface serves as the second main surface 12.

In this manner, through substeps a-1 to a-3, the transparent insulating substrate 10 can be manufactured which has the first main surface 11 with an RMS surface roughness lower than 0.7 nm, and which has the second main surface 12 with an RMS surface roughness higher than the surface roughness of the first main surface.

Incidentally, after the double-sided lapping and the etching (substep a-2), the transparent insulating substrate 10 may be annealed. It is preferable to perform the annealing after the double-sided lapping and the etching as described above because the annealing can effectively prevents the change in the wafer shape due to the subsequent single-sided polishing (substep a-3).

Meanwhile, the example has been shown herein that the transparent insulating substrate having the two rough main surfaces is prepared in substep a-1. However, it is only necessary in step a to prepare a transparent insulating substrate which finally has the first main surface with an RMS surface roughness lower than 0.7 nm and the second main surface with an RMS surface roughness higher than the surface roughness of the first main surface. The transparent insulating substrate prepared in substep a-1 does not necessarily have the two rough surfaces. For example, when a transparent insulating substrate having two main surfaces mirror-polished is prepared, and subsequently subjected to double-sided lapping and etching (substep a-2), annealing, and single-sided polishing (substep a-3), the transparent insulating substrate 10 satisfying the above-described surface roughnesses can be manufactured.

Next, in step b, the silicon film can be formed specifically as follows, for example.

First, as shown in FIG. 2(b-1), a silicon substrate 20 is prepared (substep b-1). Alternatively, a silicon substrate having an oxide film formed on a surface thereof may be optionally used. To achieve an excellent bonding state, a surface to be bonded (bonding surface) needs to have flatness at a certain level or higher. For this reason, at least the surface to be bonded is subjected to mirror-polishing or the like. This flatness is desirably lower than 0.7 nm in the RMS value, for example.

Next, as shown in FIG. 2(b-2), hydrogen ions are implanted from the surface (ion-implanted surface 22) into the silicon substrate 20 to form an ion implanted layer 21 (substep b-2).

It is not limited to the hydrogen ions that are implanted for the formation of this ion implanted layer 21. Instead, rare gas ions or both hydrogen ions and rare gas ions may be implanted. The implantation energy, implantation dose, implantation temperature, and other ion implantation conditions should be appropriately selected so that a film having a predetermined thickness can be obtained. As the specific examples, the temperature of the substrate during the implantation may be set to 250 to 400° C., the ion implantation depth may be set to 0.5 μm, the implantation energy may be set to 20 to 100 keV, and the implantation dose may be set to $1 \times 10^{16}$ to $1 \times 10^{17}/cm^2$. However, the ion implantation conditions are not limited thereto.

Incidentally, a single crystal silicon substrate having an oxide film formed on a surface or surfaces thereof can be optionally used. Using such a silicon substrate having the oxide film formed on the surface and implanting ions through the oxide film achieve an effect of suppressing channeling of the implanted ions. This can further suppress the variation in the ion implantation depth. Consequently, a film having a relatively uniform thickness can be formed.

Next, as shown in FIG. 2(b-3), the ion-implanted surface 22 of the silicon substrate 20 is bonded onto the first main surface 11 of the transparent insulating substrate 10 (substep b-3).

In bonding the silicon substrate 20 onto the transparent insulating substrate 10,
the first main surface 11 and the ion-implanted surface 22 are the sufficiently flat surfaces as mentioned above. Accordingly, the two substrates, for example, a synthetic quartz substrate and a silicon substrate, can be bonded by only bonding at room temperature and being pressurized.

For stronger bonding, however, the bonding is preferably performed as follows.

Specifically, a surface activation treatment is desirably performed in advance on both the ion-implanted surface 22 of the silicon substrate 20 and the first main surface 11 of the transparent insulating substrate 10. The surface activation treatment may be performed only on either the ion-implanted surface 22 of the silicon substrate 20 or the first main surface 11 of the transparent insulating substrate 10.

In this event, the surface activation treatment may be a plasma treatment. When the plasma treatment is performed as the surface activation treatment as described above, the treated surface of a substrate is activated, for example, in such a way that the number of OH groups on the surface is increased. Accordingly, when the ion-implanted surface 22 of the silicon substrate 20 is bonded onto the first main surface 11 of the transparent insulating substrate 10 in this state, the substrates can be tightly bonded together with a hydrogen bond and so forth. Alternatively, an ozone treatment or the like can be performed as the surface activation treatment, or several types of treatments may be performed in combination.

The treatment with plasma may be performed as follows. Specifically, a substrate cleaned by RCA cleaning or the like is placed in a vacuum chamber. After a plasma gas is introduced therein, the substrate is exposed to a high-frequency plasma of preferably approximately 100 W for approximately 5 to 30 seconds so as to have its surface subjected to the plasma treatment. Examples of the plasma gas usable include: the plasma of an oxygen gas for treating a single crystal silicon substrate having an oxide film formed on a surface thereof; and a hydrogen gas, an argon gas, a gas mixture of a hydrogen gas and an argon gas, or a gas mixture of a hydrogen gas and a helium gas for treating a single crystal silicon substrate having no oxide film formed on a surface thereof. Alternatively, a nitrogen gas that is an inert gas may be used.

The treatment with ozone may be performed as follows. Specifically, a substrate cleaned by RCA cleaning or the like is placed in a chamber in which an air has been introduced. After a plasma gas such as a nitrogen gas or an argon gas is introduced therein, a high-frequency plasma is generated to convert oxygen in the air into ozone. Thus, the surface of the substrate is subjected to the ozone treatment.

The substrates can be tightly bonded together without a high temperature treatment, as far as the substrates are bonded together, for example, under a reduced pressure or a normal pressure at room temperature while the surface subjected to the surface activation treatment as described above is used as a bonding surface.

Here, after the silicon substrate is bonded onto the transparent insulating substrate, a heat treatment step of heating the bonded substrates at preferably 100 to 300° C. may be performed.

When the silicon substrate is bonded onto the transparent insulating substrate and then the heat treatment at preferably 100 to 300° C. is performed on the bonded substrates as described above, the bonding strength between the silicon substrate and the transparent insulating substrate can be increased. Moreover, the heat treatment at the above described temperature is less likely to cause thermal strain, crack, detachment, and the like due to a difference in thermal expansion coefficient attributed to the use of different kinds of materials. The increase in the bonding strength can make defects less likely to occur in a peeling step.

Next, the peeling step is performed in which the silicon substrate 20 is separated at the ion implanted layer 21 so as to transform the silicon substrate 20 into film. Thus, as shown in FIG. 2(b-4), a silicon film 31 is formed (step b-4).

The separation of this silicon substrate (peeling, transformation into film) can be performed, for example, through application of a mechanical external force thereto. The mechanical external force is not particularly limited. Examples thereof include a gas or liquid blow or a physical impact to a side surface of the ion implanted layer.

Through the steps as described above, an SOI substrate 30 comprising the film 31 on the first main surface 11 of the transparent insulating substrate 10 can be manufactured.

Incidentally, it is needless to say that a series of substeps a-1 to a-3 and a series of substeps b-1 to b-2 described above are treatments on respective substrates, and thus these series of substeps may be performed in reversed order, or may be performed concurrently.

The reasons why the first main surface 11 of the transparent insulating substrate 10 is made to have an RMS surface roughness lower than 0.7 nm in step a in the present invention are as follows. One reason is that if the surface roughness is higher than the value (i.e., lower in flatness), the first main surface 11 does not easily allow the silicon film to be bonded thereto by means of bonding or the like. Another reason is that even if the silicon film is formed thereon, voids or the like that are a non-bonded portions occur, thereby making it difficult for the silicon film to favorably retain its crystallinity.

The lower limit value of the RMS surface roughness of the first main surface 11 is not particularly limited, and the higher flatness is more preferable. The improvement of the flatness, however, involves a cost problem, and thus the RMS surface roughness may be practically set to approximately 0.1 nm or higher.

On the other hand, when the second main surface 12 of the transparent insulating substrate 10 has the RMS surface roughness higher than the surface roughness of the first main surface as described above, the recognition unit recognizes the substrate more easily. Although depending on the performance of the recognition unit and other conditions, the RMS value is preferably, for example, 0.7 nm or higher because such an RMS value makes the recognition easy.

Note that the upper limit of the RMS surface roughness of the second main surface 12 is not particularly limited. In view of the point that the recognition unit recognizes the substrate more easily, the higher the value is more preferable. However, in consideration of preventing the generation of particles, it is preferable that the surface roughness should not be higher than necessary. The upper limit of the RMS value may be approximately 50 nm, for example.

Meanwhile, when the transparent insulating substrate is a glass substrate, the step of roughening can comprise at least sandblasting the first and the second main surfaces of the glass substrate, and cleaning the sandblasted surfaces of the glass substrate, the cleaning comprising at least alkali cleaning after HF cleaning on the sandblasted surfaces.

In this manner, first, HF cleaning is performed on the sandblasted surfaces of the glass substrate. By the etching effect of the HF solution on the glass substrate, a portion which can be a particle source characteristic of the sandblasting process such as an acute portion, a crack and a damaged portion of the sandblasted glass surfaces can be removed. After the etching, foreign matter released and re-adhered to the surfaces during the HF cleaning can be removed by the alkali cleaning. Thus, the glass substrate is obtainable which has an extremely small number of particles even after sandblasting. Moreover, since the alkali cleaning is performed using an alkali solution for this removal of the foreign matter, the foreign matter once removed hardly re-adheres in the alkali solution, thereby achieving effective cleaning.

In this case, the glass substrate may be a quartz glass substrate.

Even in a case of such an insulator to which foreign matter is especially likely to adhere, foreign matter released during the HF cleaning after sandblasting can be removed and prevented from re-adhering, thereby achieving effective cleaning.

Moreover, the glass substrate may be in a wafer form.

According to this cleaning method, a glass wafer especially having a particle problem can be made into a wafer without particles.

In this case, the wafer may have a single crystal silicon layer stacked thereon.

Even in a case of a wafer having a single crystal silicon layer stacked on the glass wafer, even when foreign matter released from the sandblasted surfaces adheres to the single crystal silicon layer during the HF cleaning, this cleaning method allows the foreign matter to be removed by the subsequent alkali cleaning. Thus, occurrence of particles from the single crystal silicon layer can be prevented.

In the above case, the HF cleaning can be performed while the single crystal silicon layer on the wafer is protected with a protection tape or an organic protection film.

Protecting the single crystal silicon layer during the HF cleaning in this manner has the following advantages. Specifically, the single crystal silicon layer is etched with the HF solution to a lesser extent. Moreover, foreign matter released from the sandblasted surfaces can be prevented from adhering to the single crystal silicon layer during the HF cleaning. Thus, the wafer is obtainable which has the single crystal silicon layer with a smaller number of particles.

Meanwhile, the alkali solution used in the alkali cleaning may be any one of $NH_4OH$, $NaOH$, $KOH$, and $CsOH$, or any one of these with $H_2O_2$ added.

The alkali solution used in the alkali cleaning can be appropriately selected among these. With the further addition of $H_2O_2$, such an alkali solution acquires the oxidizing power, and can remove foreign matter more effectively.

Furthermore, the alkali solution used in the alkali cleaning is preferably an SC1 solution, containing at least, in a volume composition ratio, 0.5 to 2 of a 29% by weight aqueous $NH_4OH$ solution, 0.01 to 0.5 of a 30% by weight aqueous $H_2O_2$ solution, and 10 of $H_2O$.

The use of the SC1 solution having such a concentration composition for the alkali cleaning allows efficient removal of foreign matter adhered to the glass substrate and prevention of the foreign matter from re-adhering to the glass substrate. Moreover, making the concentration ratio of $H_2O_2$ lower than that in the normal SC1 solution as described above makes it possible to keep the etching effect of the alkali appropriate.

Furthermore, the alkali solution used in the alkali cleaning may be an alkaline organic solvent.

Such an alkaline organic solvent can be also used in the alkali cleaning.

Meanwhile, the HF cleaning step preferably comprises etching the sandblasted surfaces of the glass substrate by 20 nm or more.

Etching the sandblasted surfaces of the glass substrate by 20 nm or more in this manner can let portions of the sandblasted surfaces which can be the source of particles and include an acute portion, a crack and a damaged portion, be etched to such an extent that no dust occurs in a later step.

Figure 3:
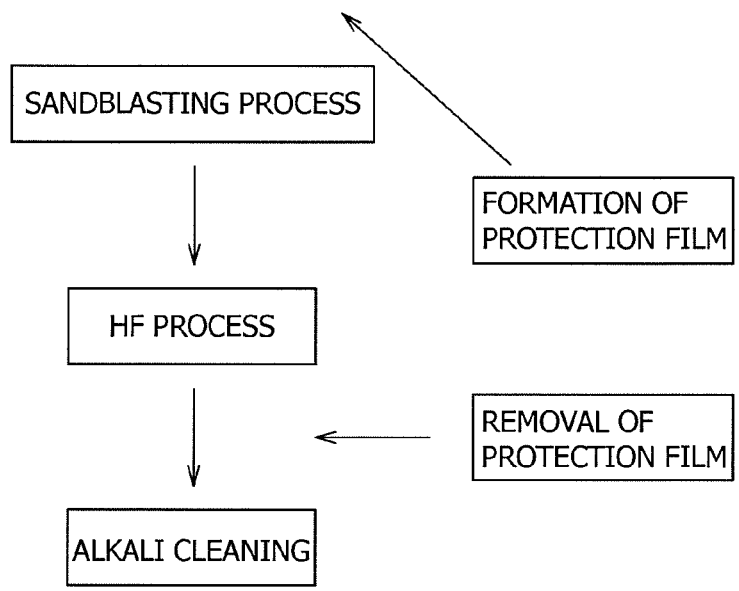
FIG. 3 is a flowchart showing one example of a cleaning step for a surface of a glass substrate subjected to a sandblasting process.

FIG. 3 is a flowchart showing one of embodiments from the sandblasting to the cleaning on the glass substrate.

As shown in FIG. 3, first, the sandblasting is performed on the glass substrate.

The method of this sandblasting is not particularly limited. For example, a surface to be processed can be roughened by applying particles of alumina, quartz, or the like to the surface, using the same apparatus as the conventional one.

Types of glass substrates to which this cleaning method is applicable include a $SiO_2$-based substrate or the like. For example, the method is applicable to a quartz glass substrate. Even in a case of such an insulator that is likely to be charged, this cleaning method can prevent the particles from re-adhering during the cleaning after the sandblasting process. Thus, favorable cleaning can be carried out.

Alternatively, the glass substrate may be in a wafer form, or may be a quartz boat which can be used during a heat treatment on a semiconductor wafer, for example.

Furthermore, the method is also applicable to even a wafer having a single crystal silicon layer stacked thereon. Even in a case of such a wafer having a single crystal silicon layer stacked thereon, alkali cleaning in this cleaning method can remove foreign matter released from the processed surfaces and adhered to the single crystal silicon layer during the HF cleaning and can prevent the foreign matter from re-adhering. Thus, this method can effectively reduce the number of particles. Moreover, since the alkali cleaning is performed after the HF cleaning, the particles can be removed without performing the HF cleaning for a long period, and the number of foreign matter adhered to the single crystal silicon layer during the HF cleaning can be kept small. Furthermore, even in a case of a wafer, such as SOQ (Silicon on Quartz), SOG (Silicon on Glass), or the like where the particle problem especially occurs, this cleaning method can produce a wafer having few particles.

Next, as shown in FIG. 3, HF cleaning is performed on the sandblasted surfaces of the glass substrate. Any one containing hydrofluoric acid can be used as hydrofluoric acid for this HF cleaning. For example, a hydrofluoric acid solution, an aqueous buffered hydrofluoric acid solution, and the like can be used. Moreover, the cleaning method is not particularly limited. The sandblasted glass substrate may be, for example, immersed, or the sandblasted surfaces may be cleaned through spin coating.

By firstly performing HF cleaning on the sandblasted surfaces of the glass substrate, an uneven portion such as a crack which can be a particle source and which is formed as a result of the sandblasting can be removed by etching. In this event, the sandblasted surfaces of the glass substrate are preferably etched by 20 nm or more by the HF cleaning. Consequently, the particle source can be removed to such a degree that no dust occurs in a later step.

Meanwhile, when the glass substrate to be cleaned by this cleaning method is the wafer having a single crystal silicon stacked thereon, it is preferable to perform this HF cleaning while the single crystal silicon layer is protected with a protection tape or an organic protection film. This protection may be formed before the HF cleaning, or before the sandblasting. Forming the protection before the sandblasting can efficiently prevent occurrence of particles from the single crystal silicon layer.

As the organic protection film, for example, an organic film such as a photoresist film can be formed. Additionally, the protection tape can be pasted on the organic film or can be pasted directly on the single crystal silicon layer.

When the protection film is removed before the alkali cleaning where few foreign matter adheres, the particles can be removed from the single crystal silicon layer by the alkali cleaning. Alternatively, the protection film can be removed after the alkali cleaning.

Next, as shown in FIG. 3, the alkali cleaning is performed.

By performing the alkali cleaning after the HF cleaning, foreign matter etched, released and re-adhered during the HF cleaning is removed by the alkali cleaning. Moreover, the foreign matter is also prevented from re-adhering in the alkali solution. Consequently, particles can be efficiently removed.

As the alkali solution used in this cleaning, any one of $NH_4OH$, $NaOH$, $KOH$, and $CsOH$, any one of these with $H_2O_2$ added; or an alkaline organic solvent such as EDP (Ethylene diamine-pyrocatechol-water), TMAH (Tetramethyl ammonium hydroxide), or hydrazine can be used.

Furthermore, as the alkali solution, an SC1 solution containing, in a volume composition ratio, 0.5 to 2 of a 29% by weight aqueous $NH_4OH$ solution, 0.01 to 0.5 of 30% by weight aqueous $H_2O_2$ solution, and 10 of $H_2O$ is preferably used. The SC1 solution with such a concentration composition ratio has the enhanced cleaning effect of the oxidizing power of $H_2O_2$, the concentration ratio of $H_2O_2$ lower than that of a normal SC1 solution, and an appropriate alkalinity. Accordingly, the etching effect can be maintained, and furthermore foreign matter can also be prevented from re-adhering during the cleaning.

As described above, first, a particle source characteristic of the sandblasted surfaces of the glass substrate, such as a damaged portion, can be removed by the HF cleaning. Then, by performing the alkali cleaning, foreign matter released and re-adhered during the HF cleaning can be removed while being prevented from further re-adhering. Consequently, effective cleaning can be carried out. When this cleaning method is applied to clean a substrate such as a glass substrate on which a fogging treatment needs to be performed by a sandblasting process intentionally, it is possible to produce a glass product with few particles while keeping the effect of the fogging treatment.

EXAMPLES

Hereinbelow, the present invention will be more specifically described with Examples and Comparative Examples of the present invention. However, the present invention is not limited thereto.

Example 1

According to the method for manufacturing an SOI substrate by using a bonding method, as shown in FIG. 2, thirty transparent SOI substrates were manufactured as follows.

First, a synthetic quartz substrate 10' having a diameter of 150 mm was prepared by being cut out directly from a synthetic quartz ingot (substep a-1).

Next, double-sided lapping was performed on both surfaces of this synthetic quartz substrate 10' with a double-sided lapping machine, and etching was performed thereon using hydrofluoric acid (substep a-2). Then, the synthetic quartz substrate was annealed under a non-oxidizing atmosphere at 1100° C. for 30 minutes.

The synthetic quartz substrate 10" had only one of the surfaces polished by using a one surface polisher. Thus, one main surface (first main surface) 11 had an RMS surface roughness of 0.2 nm (substep a-3). The other main surface (second main surface) 12 had an RMS surface roughness of 1.0 nm.

Next, a single crystal silicon substrate having been mirror-polished and having a diameter of 150 mm was prepared as a silicon substrate 20. Then, a silicon oxide film layer of 100 nm was formed on surfaces of the silicon substrate by thermal oxidation (substep b-1).

Next, hydrogen ions were implanted into the silicon substrate 20 through the silicon oxide film layer formed thereon to thereby form a micro bubble layer (ion implanted layer) 21 which was parallel to the surface with respect to the average travel depth of the ions (substep b-2). As the ion implantation conditions, the implantation energy was 35 keV, the implantation dose was $9 \times 10^{16}/cm^2$, and the implantation depth was 0.3 μm.

Next, the ion-implanted silicon substrate 20 was placed in a plasma treatment apparatus. After nitrogen gas was introduced as a plasma gas therein, a high-frequency plasma treatment was performed on the ion-implanted surface for 10 seconds by applying a high frequency of 13.56 MHz between parallel plate electrodes each having a diameter of 300 mm, under a high-frequency power of 50 W and a reduced pressure of 2 Torr (270 Pa). In this manner, a surface activation treatment was performed on the ion-implanted surface 22 of the silicon substrate 20.

Meanwhile, the synthetic quartz substrate 10 was placed in a plasma treatment apparatus. After nitrogen gas was introduced therein as a plasma gas in a narrow space between electrodes, the synthetic quartz substrate 10 was subjected to a high-frequency plasma treatment for 10 seconds by applying a high frequency between the electrodes to generate plasma. In this manner, a surface activation treatment was also performed on the first main surface 11 of the synthetic quartz substrate 10.

The silicon substrate 20 and the synthetic quartz substrate 10 subjected to the surface activation treatments as described above were bonded together at room temperature, using the activated surfaces as the bonding surfaces. Then, the back surfaces of the respective substrates were strongly pressed against each other in a thickness direction (step b-3).

Next, in order to increase the bonding strength, substrates obtained by bonding the silicon substrate 20 and the synthetic quartz substrate 10 were subjected to a heat treatment at 300° C. for 30 minutes.

Next, an external impact was applied to the ion implanted layer 21 of the silicon substrate 20. The silicon substrate was gradually separated along the ion implanted layer 21, and thereby a silicon film 31 was left behind (substep b-4).

A transparent SOI substrate 30 comprising the synthetic quartz substrate 10 and the silicon film 31 thereon was manufactured in this manner. A recognition test was conducted on manufactured transparent SOI substrates 30 by using a substrate-recognition unit equipped to a device-fabrication apparatus. As a result, all the substrates were accurately recognized.

Example 2

Comparative Examples 1 to 3

First, eight quartz wafers were sandblasted.
Next, each two of the wafers were treated under each of the following conditions.

Example 2

The wafers were immersed in 2% by weight HF solution for 30 minutes, and subsequently immersed in an alkali solution ($NH_4OH:H_2O_2:H_2O_2=1:0.2:10$ at weight ratio) for 10 minutes.

Comparative Example 1

No cleaning was performed on the wafers.

Comparative Example 2

The wafers were immersed in 2% by weight HF solution for 30 minutes.

Comparative Example 3

The wafers were immersed in an alkali solution ($NH_4OH:H_2O_2:H_2O=1:0.2:10$ at weight ratio) for 10 minutes.

Figure 4:
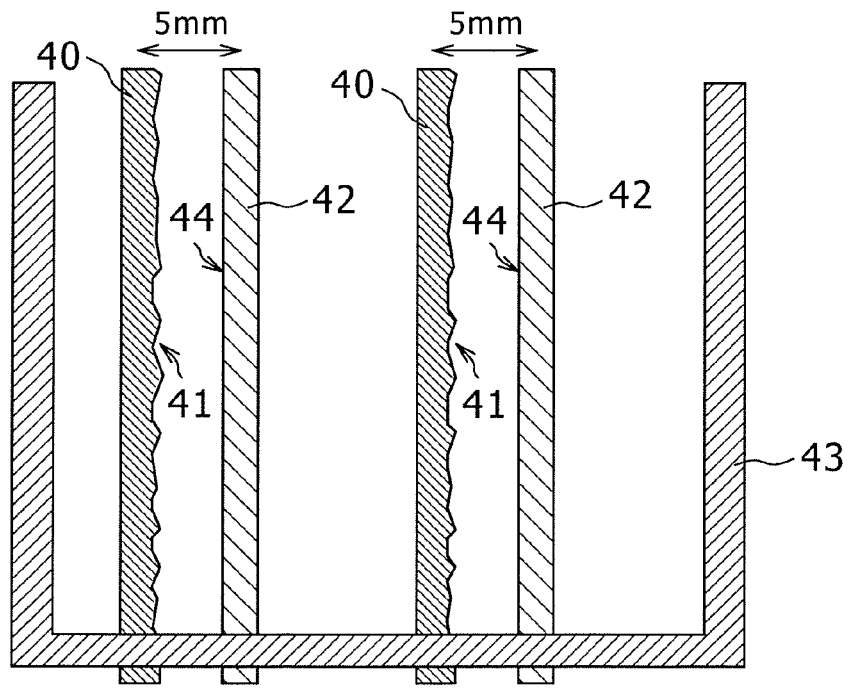
FIG. 4 is a schematic view of a state where a wafer is disposed in a cleaning cassette when cleaning is performed to estimate the number of foreign matter adhered to the wafer.
Figure 5:
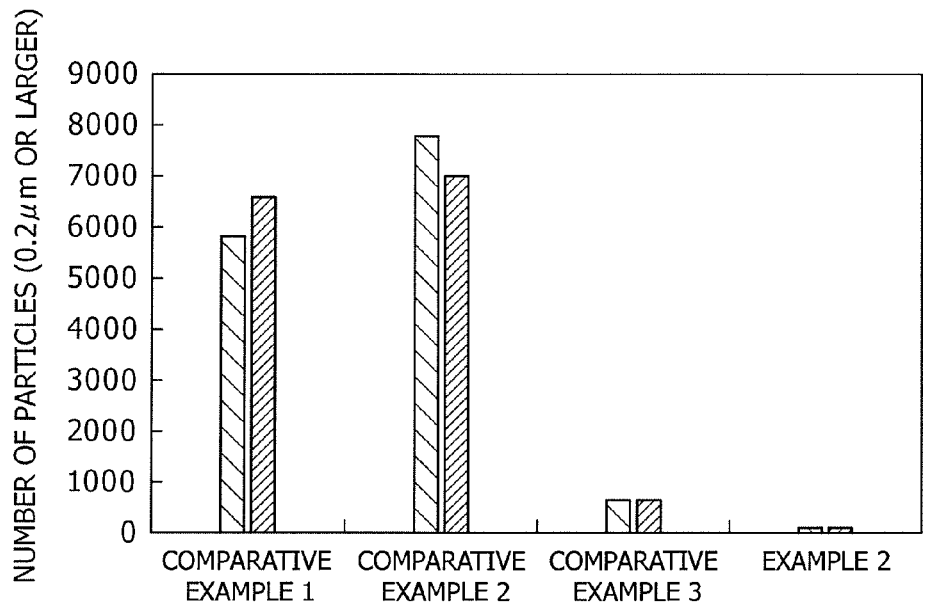
FIG. 5 shows a result of measuring the number of particles.

Next, four wafers in total were disposed in a cleaning cassette 43 as shown in FIG. 4. Specifically, the four wafers include: two quartz wafers 40 treated under the same conditions as the aforementioned conditions for the quartz wafers 40; and two test silicon wafers 42 not subjected to the sandblasting. The wafers were disposed in a way that sandblasted surfaces 41 respectively faced to particle-test surfaces 44 of the test silicon wafers 42. Here, the distance between each pair of the quartz wafer 40 and the test silicon wafer 42 was set to 5 mm. In this state, normal RCA cleaning was performed. Then, the number of particles (0.2 µm or larger) on the test surface 44 of the silicon wafer 42 was measured with a particle counter. Based on the number of particles, the number of foreign matter adhered to the quartz wafer 40 was estimated. FIG. 5 shows the measurement result.

As shown in FIG. 5, an extremely small number of particles were measured from the wafers of Example 2 where the HF cleaning was performed and followed by the alkali cleaning, in comparison with those in Comparative Examples 1 to 3. Additionally, a larger number of particles were measured from the wafers of Comparative Example 2 where only the HF cleaning was performed, than that in Comparative Example 1 where no cleaning was performed. In comparison with those in Comparative Examples 1 and 2, the number of particles was relatively small in Comparative Example 3 where only the alkali cleaning was performed; however, the removal of the particle source was unsuccessful.

Examples 3 to 7

First, six quartz wafers were sandblasted.
Next, each two of the wafers were treated under each of the following conditions.

Example 3

The wafers were immersed in 2% by weight HF solution for 30 minutes, and subsequently immersed in 3% by volume NH$_4$OH solution for 10 minutes.

Example 4

The wafers were immersed in 2% by weight HF solution for 30 minutes, and subsequently immersed in an alkali solution (NH$_4$OH:H$_2$O$_2$:H$_2$O=1:1:10 at weight ratio) for 10 minutes.

Example 5

The wafers were immersed in 2% by weight HF solution for 30 minutes, and subsequently immersed in an alkali solution (NH$_4$OH:H$_2$O$_2$:H$_2$O=1:0.2:10 at weight ratio) for 10 minutes.

Example 6

The wafers were immersed in 2% by weight HF solution for 30 minutes, and subsequently immersed in an alkaline organic solvent (8% TMAH solution) for 10 minutes.

Example 7

The wafers were immersed in 2% by weight HF solution for 30 minutes, and subsequently immersed in an alkali solution (10 wt% KOH solution) for 10 minutes.

Next, four wafers in total were disposed in a cleaning cassette 43 as shown in FIG. 4. Specifically, the four wafers include: two quartz wafers 40 treated under the same conditions as the aforementioned conditions for the quartz wafers 40; and two test silicon wafers 42 not subjected to the sandblasting. The wafers were disposed in a way that sandblasted surfaces 41 respectively faced to particle-test surfaces 44 of the test silicon wafers 42. Here, the distance between each pair of the quartz wafer 40 and the test silicon wafer 42 was set to 5 mm. In this state, normal RCA cleaning was performed.

Figure 6:
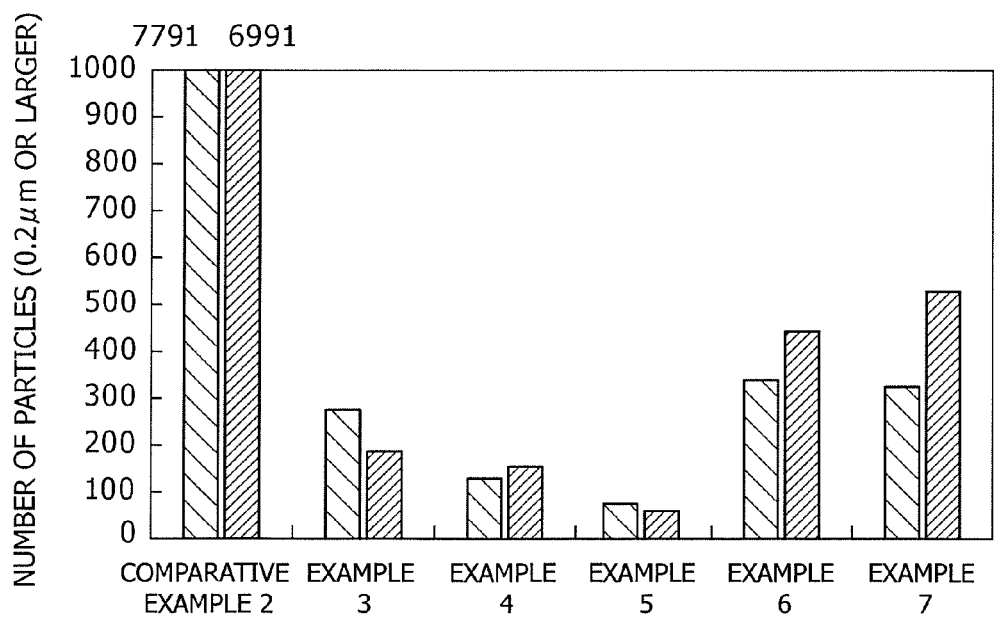
FIG. 6 shows a result of measuring the number of particles.

Then, the number of particles (0.2 µm or larger) on the test surface 44 of the test silicon wafer 42 was measured with a particle counter. Based on the number of particles, the number of foreign matter adhered to the quartz wafer 40 was estimated. FIG. 6 shows the measurement result of Examples 3 to 7 in addition to the measurement result of Comparative Example 2 where only the HF cleaning was performed in the same condition as above.

As shown in FIG. 6, the number of particles measured in Examples 3 to 7 where the alkali cleaning was performed after the HF cleaning was significantly small, in comparison with the number measured in Comparative Example 2 where only the HF cleaning was performed in the same condition as above. Consequently, the number of particles can be greatly reduced by the alkali cleaning. Additionally, the number of particles was the smallest by the alkali cleaning in Example 5. This is attributable to a synergy effect of the oxidizing power of H$_2$O$_2$ with NH$_4$OH in the alkali solution of Example 5. Since the alkali solution of Example 5 has the concentration of H$_2$O$_2$ lower than that in the alkali solution of Example 4, the etching effect of the alkali is not deteriorated. Consequently, particles are efficiently removed.]

As described above, a cleaning method in which alkali cleaning is performed after HF cleaning has the following effects. Specifically, unevenness, which can be a particle source characteristic of sandblasted surfaces of a glass is etched by the HF cleaning. Furthermore, foreign matter released and adhered during the HF cleaning can be removed by the alkali cleaning while being prevented from re-adhering. Thus, the number of particles can be efficiently reduced.

It should be noted that the present invention is not limited to the above-described embodiments. The embodiments are exemplary, and embodiments having substantially the same configuration as and exhibiting similar function and effects to those of a technological idea described in scope of claims of the present application are contained by the technological scope of the present invention.

What is claimed is:

1. A method for manufacturing an SOI substrate, the substrate comprising at least a transparent insulating substrate and a silicon film formed on a first main surface of the transparent insulating substrate, while a second main surface of the transparent insulating substrate, an opposite to the first main surface, being roughened,
the method comprising at least the steps of:
roughening the first main surface with an RMS surface roughness lower than 0.7 nm and the second main surface with an RMS surface roughness higher than the surface roughness of the first main surface to prepare the transparent insulating substrate;
forming the silicon film on the first main surface of the transparent insulating substrate,
wherein the transparent insulating substrate is a glass substrate, and
the step of roughening comprises at least sandblasting the first and the second main surfaces of the glass substrate, and cleaning the sandblasted surfaces of the glass substrate, and the cleaning comprises alkali cleaning after HF cleaning on the sandblasted surfaces.

2. The method for manufacturing an SOI substrate according to claim 1, wherein the step of roughening comprises at least:
performing double-sided lapping and etching on the first main surface and the second main surface; and then
performing single-sided polishing on only the first main surface.

3. The method for manufacturing an SOI substrate according to claim 2, comprising annealing the transparent insulating substrate after performing the double-sided lapping and the etching but before performing the single-sided polishing.

4. The method for manufacturing an SOI substrate according to claim 1, wherein the step of forming the silicon film on the first main surface of the substrate comprises at least:
   implanting hydrogen ions and/or rare gas ions from a surface of a silicon substrate or a silicon substrate having an oxide film formed thereon to form an ion implanted layer;
   bonding the ion-implanted surface of the silicon substrate or the silicon substrate having the oxide film formed thereon onto the first main surface of the transparent insulating substrate; and
   peeling the bonded silicon substrate or the bonded silicon substrate having the oxide film formed thereon along the ion implanted layer as a boundary to form the silicon film on the first main surface of the transparent insulating substrate.

5. The method for manufacturing an SOI substrate according to claim 1, wherein an alkali solution used in the alkali cleaning is an alkaline organic solvent.

6. The method for manufacturing an SOI substrate according to claim 1, wherein the HF cleaning comprises etching the sandblasted surfaces of the glass substrate by 20 nm or more.

7. The method for manufacturing an SOI substrate according to claim 1, wherein the glass substrate is a quartz glass substrate.

8. The method for manufacturing an SOI substrate according to claim 1, wherein an alkali solution used in the alkali cleaning is any one of $NH_4OH$, $NaOH$, $KOH$ and $CsOH$, or any one of these with $H_2O_2$ added.

9. The method for manufacturing an SOI substrate according to claim 1, wherein an alkali solution used in the alkali cleaning is an SC1 solution which contains at least, in a volume composition ratio, 0.5 to 2 of a 29% by weight aqueous $NH_4OH$ solution, 0.01 to 0.5 of a 30% by weight aqueous $H_2O_2$ solution, and 10 of $H_2O$.

* * * * *

UNITED STATES PATENT AND TRADEMARK OFFICE
CERTIFICATE OF CORRECTION

PATENT NO.       : 8,420,503 B2
APPLICATION NO.  : 12/933113
DATED            : April 16, 2013
INVENTOR(S)      : Shoji Akiyama et al.

Page 1 of 1

It is certified that error appears in the above-identified patent and that said Letters Patent is hereby corrected as shown below:

Title page, item [73] Assignee should read as follows:
-- Shin-Etsu Chemical Co., Ltd. --

Signed and Sealed this
First Day of October, 2013

Teresa Stanek Rea
*Deputy Director of the United States Patent and Trademark Office*